US011395434B2

(12) United States Patent
Chang et al.

(10) Patent No.: US 11,395,434 B2
(45) Date of Patent: Jul. 19, 2022

(54) HDD PARTITION WITH DUMMY HDD COVER DESIGN

(71) Applicant: Quanta Computer Inc., Taoyuan (TW)

(72) Inventors: Chun Chang, Taoyuan (TW);
Hsin-Chieh Lin, Taoyuan (TW);
Yao-Long Lin, Taoyuan (TW);
Shao-Jie Wu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/089,561

(22) Filed: Nov. 4, 2020

(65) Prior Publication Data
US 2022/0039284 A1 Feb. 3, 2022

Related U.S. Application Data

(60) Provisional application No. 63/059,743, filed on Jul. 31, 2020.

(51) Int. Cl.
*H05K 7/14* (2006.01)
(52) U.S. Cl.
CPC ......... *H05K 7/1494* (2013.01); *H05K 7/1491* (2013.01); *H05K 7/1492* (2013.01)
(58) Field of Classification Search
CPC ... H05K 7/1494; H05K 7/1491; H05K 7/1492
See application file for complete search history.

(56) References Cited

U.S. PATENT DOCUMENTS

| 5,679,923 A | * | 10/1997 | Le | G06F 1/182 |
|---|---|---|---|---|
| | | | | 174/372 |
| 10,631,447 B1 | * | 4/2020 | Fu | H05K 9/0016 |

OTHER PUBLICATIONS

Screen captures from YouTube video clip entitled "$850 Gaming Build—NZST S340 / Pentium G3258 / GTX 770" uploaded on Sep. 19, 2014 by user "PCPartPicker". Retrieved from Internet: https://www.youtube.com/watch?v=Ng2IldmiU9l&t=863s.*

* cited by examiner

*Primary Examiner* — James Wu
*Assistant Examiner* — Hung Q Dang
(74) *Attorney, Agent, or Firm* — Nixon Peabody LLP

(57) ABSTRACT

A component for a cage is for holding electronic devices in a computing system. The component includes a cover with a hook, an emboss, and a main panel. The cover may be couplable to the cage by the hook and emboss. The component also includes a partition with a primary panel. The partition may be couplable to the cage by the primary panel. The cover is detachable from the partition. After the cover is detached from the partition, the cover may be rotated approximately 180 degrees and reinstalled into the cage. The cover may also include another emboss to fix the cover into the cage when the cover is installed in a rotated position. The cage may also include a top portion and a bottom portion. The top and bottom portions of the cage may include features that assist the partition and the cover to maintain a fixed position.

20 Claims, 17 Drawing Sheets

HDD PARTITION WITH DUMMY HDD COVER DESIGN

RELATED APPLICATIONS

This application claims priority under 35 U.S.C. § 119 to U.S. Provisional Application No. 63/059,743, entitled "HDD Partition With Dummy HDD Cover Design By Semi-Piercing Feature," and filed on Jul. 31, 2020. The contents of that application are hereby incorporated by reference in their entirety.

TECHNICAL FIELD

The present disclosure relates generally to an enclosure for a server system component, and more specifically, to a re-usable cover for a memory storage device carrier that connects to the server system and allows for airflow.

BACKGROUND

Computer enclosures and other types of electronic equipment are often mounted in a vertical rack structure. Within each rack structure, there each are slots for holding the enclosures. Electronic equipment such as a server includes a chassis that contains electronic components such as processors, memory devices, network interface cards, and the like. The different chassis in the rack structure may each contain multiple carriers for memory storage devices such as a hard disk drive (HDD). A typical data center may have hundreds of servers and therefore thousands of memory storage devices.

The electronic equipment within a single chassis may be arranged with multiple carriers. The carriers may be contained within a set of cages on one side of the chassis. When the carriers are not placed in the cages of the chassis, dust and other particles in the air may enter the system through the open cage, and cause harm to the system, including reducing speed or damaging components. For example, if only one cage on the chassis of server system is vacant, then air may flow into the vacant cage rather through the server system, thereby reducing airflow within the server system. This increases the temperature by not allowing the server system to effectively and efficiently cool the components, and cause harm to the system. Speed reduction may happen as an effect from particles in the air falling on the spinning, fragile platter of a memory device, which may cause some data to be lost, or make the data more difficult to access. In addition, particles may act as insulation to trap heat inside the drive and increase temperature. Therefore, there exists a need to protect the computer system from debris entering from vacant holder slots when the carrier holders are not in use.

Carrier covers can be used to protect the electronic components when carrier holders are not in use to increase airflow within the server system. Currently, carrier covers are typically made of plastic and can only be used once, and are discarded afterwards. Additionally, plastics typically have lower melting and material deformation temperatures than most metals, which limit the maximum temperatures allowed within the server if plastic covers are used. Thus, there exists a need for a carrier cover that is re-usable and can withstand higher temperatures for prolonged periods of time.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, a component for a cage for holding electronic devices in a computing system is described. The component includes a cover that has a hook, an emboss, and a main panel. The cover is couplable to the cage by the hook and the emboss. The component further includes a partition that has a primary panel. The partition is couplable to the cage by the primary panel. The cover is detachable from the partition.

According to a configuration of the above implementation, the main panel of the cover and the primary panel of the partition are joined at a common edge. A scored line defines the common edge.

According to another configuration of the above implementation, the hook of the cover engages with a matching feature of a top portion of the cage, and the emboss of the cover engages with a matching feature of a bottom portion of the cage.

In a further aspect of the above implementation, the cage includes walls that are defined by the partition, a section of the top portion, and a section of the bottom portion.

In another aspect of the above implementation, the cover further includes a cutout positioned perpendicularly to a fan in the computing system to increase airflow.

According to another configuration of the above implementation, the cover and the partition are sheet metal. The sheet metal maintains structural integrity after the cover is removed from the partition and the cage.

In a further aspect of the above implementation, the cover is fixed to the cage in a first position. The cover is also removed from the cage and rotated approximately 180 degrees, and the rotated cover is fixed to the cage in a second position. The emboss of the cover engages with a matching feature of a top portion of the cage, and the hook of the cover engages with a matching feature of a bottom portion of the cage in the second position.

In yet a further aspect of the above implementation, the cover further includes a second emboss. The second emboss engages with a slot of the partition in the second position.

In another aspect of the above implementation, the cover further includes a cutout positioned on the main panel of the cover to assist with removal of the cover from the cage and the partition.

According to a further configuration of the above implementation, the partition is fastened to the cage via a fastener. The fastener is one of a rivet, a pin, a screw, a nail, a pin, a lever, a weld, or an adhesive.

Another aspect of the present disclosure includes a system that has multiple cages, each cage for holding an electronic component. The system includes a chassis that has a top structure and a bottom structure. The top structure and the bottom structure define the multiple cages. Each cage has a cover that has a hook, an emboss, and a main panel. The hook of the cover is couplable to the top structure, and emboss of the cover is couplable to the bottom structure of the chassis. Each cage also has a partition that has a primary panel. The partition is couplable to the cage by the primary panel. The partition is coupled between the top structure and the bottom structure of the chassis. The cover is detachable from the partition.

According to a configuration of the above implementation, the main panel of the cover and the primary panel of the partition are joined at a common edge. A scored line defines the common edge.

According to another configuration of the above implementation, one of the multiple cages contains the cover and one of the multiple cages contains a memory storage device.

In a further aspect of the above implementation, one of the multiple cages contains the cover and one of the multiple cages contains a cover in a rotated position.

In another aspect of the above implementation, the cover further includes a cutout positioned perpendicularly to a fan in the computing system to increase airflow.

According to another configuration of the above implementation, the cover and the partition are sheet metal. The sheet metal maintains structural integrity after the cover is removed from the partition and the cage.

In a further aspect of the above implementation, the cover is fixed to the cage in a first position. The cover is also removed from the cage and rotated approximately 180 degrees, and the rotated cover is fixed to the cage in a second position. The emboss of the cover engages with a matching feature of a top portion of the cage, and the hook of the cover engages with a matching feature of a bottom portion of the cage in the second position.

In yet a further aspect of the above implementation, the cover further includes a second emboss. The second emboss engages with a slot of the partition in the second position.

In another aspect of the above implementation, the cover further includes a cutout positioned on the main panel of the cover to assist with removal of the cover from the cage and the partition.

According to a further configuration of the above implementation, the partition is fastened to the cage via a fastener. The fastener is one of a rivet, a pin, a screw, a nail, a pin, a lever, a weld, or an adhesive.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1A:
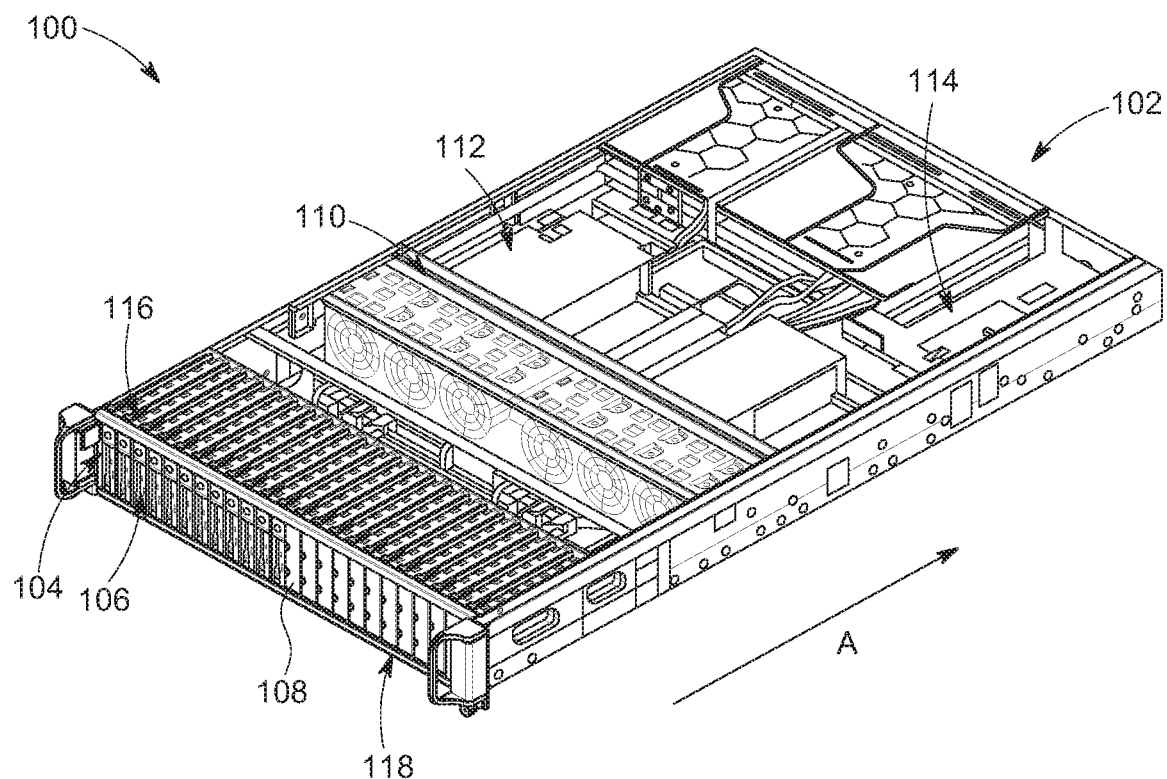
FIG. 1A is a perspective view of a server system with both carriers and example cover devices inserted in cages of the system.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed to memory carrier cover that, among other benefits, provides for easy installation and removal of the cover, permits maintained or increased airflow into a system, and may be used multiple times.

FIG. 1A illustrates a computing system such as a server system 100 having a chassis 102, a set of cages 104 that include cages with carriers 106 inserted, and empty cages with cover devices 108, a fan wall 110, a motherboard 112, a power supply 114, a top portion 116, and a bottom portion 118. In other implementations, the server system 100 may include more than the listed components or less than the listed components. In some implementations, the cages 104 are located horizontally between the top portion 116 and the bottom portion 118, both of which are approximately perpendicular from each other. In some implementations, the cages 104 are considered slots, holders, containers, receptacles, slits, apertures, or openings. The cages 104 are vertically positioned next to each other along the length of the top portion 116 and bottom portion 118. In some implementations, the cages 104 may be filled with carriers such as the cages with carriers 106. The carriers may include devices such as hard disk drives (HDD), solid state drives (SSD), flash storage devices, or other types of computer storage or memory devices. In other implementations, the cages 104 may be empty and thus have cover devices 108 inserted as will be explained herein.

The fan wall 110 may include one or more fans of different sizes to serve the function of generating air flow thereby regulating temperature within the server system 100, including directing air flow between the components of the server system 100. FIG. 1A shows an arrow A, which represents the direction of airflow in the server system 100. In other implementations, the direction of airflow A may be modified to optimize the temperature in the server system 100.

Figure 1B:
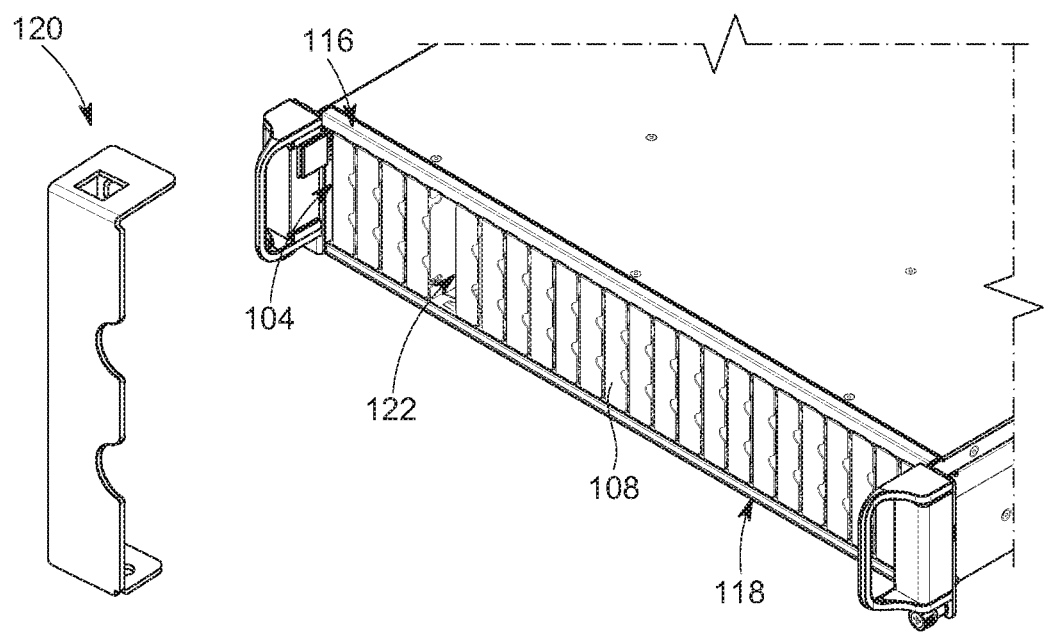
FIG. 1B is a perspective view of a removed example cover from a server system.

FIG. 1B is perspective view of a removed carrier cover 120 from the server system 100. The removed cover 120 is an example of the cover of the cages with cover devices 108. In addition to illustrating the cages with cover devices 108, the server system 100 in FIG. 1B also illustrates an empty cage 122. As previously described, the empty cage 122 may decrease airflow within the system and be exposed to debris and other particles that may damage electronic equipment in the server system 100 if either a carrier or a cover is not inserted in the empty cage 122.

Figure 2A:
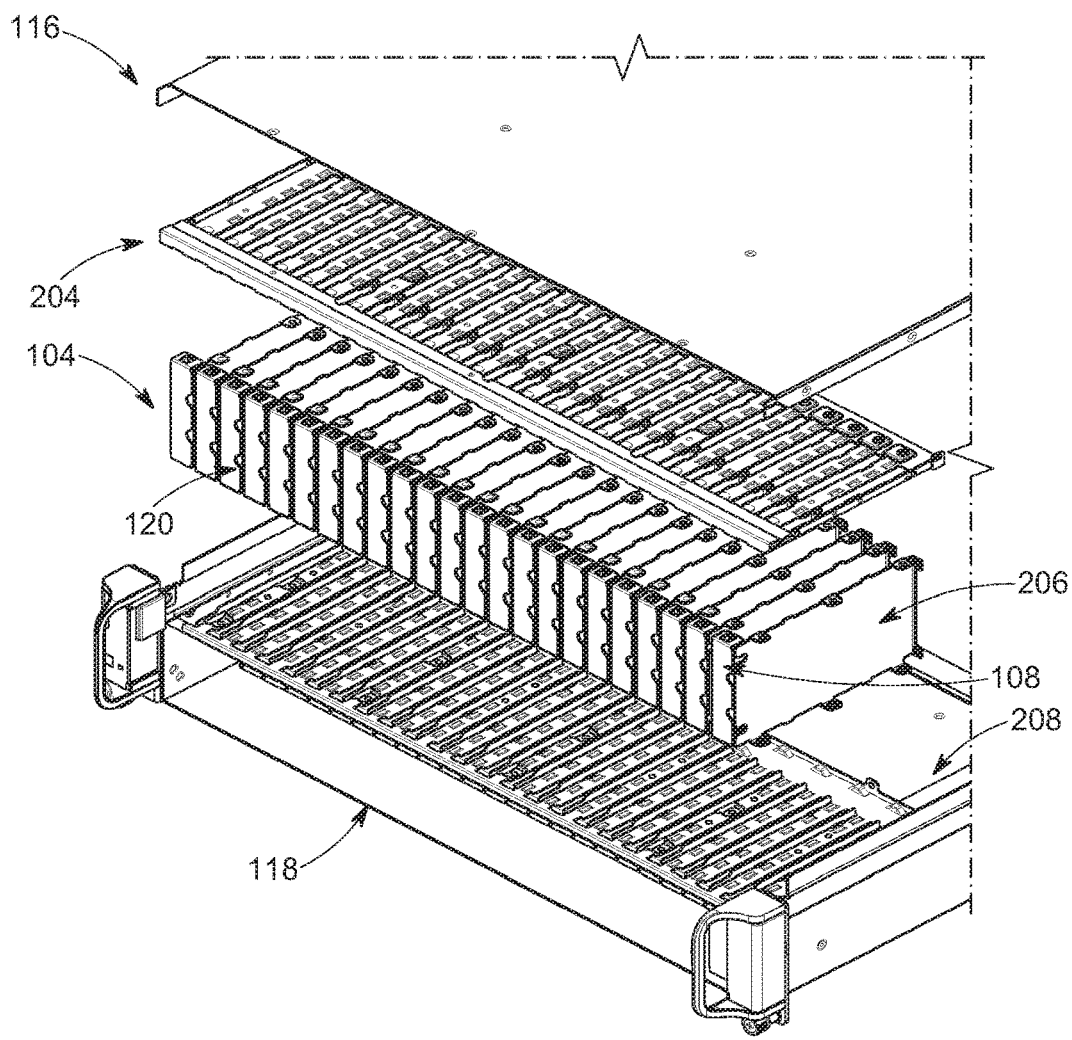
FIG. 2A is an exploded view of a set of cages of the server system of FIG. 1 with example cover devices.

FIG. 2A illustrates an exploded view of the set of cages 104 of the server system 100 of FIG. 1A. Like elements in FIG. 1A are labeled with the same reference numbers in FIGS. 2A-C. FIG. 2A shows an example of the covers 120 in the cages with cover devices 108. The cages 104 may be mounted in a server system, such as the server system 100, to hold additional storage and memory devices in carriers. The server system 100 may include the set of cages 104, the top portion 116, a carrier partition top 204, a series of partitions 206, cages with cover devices 108, a carrier partition bottom 208, and the bottom portion 118. In other implementations, the server system 100 may include more than the listed components or less than the listed components. The top portion 116 is secured to the carrier partition top 204 by various means such as fastening or welding. The carrier partition bottom 208 is secured to the bottom portion 118 by various means such as fastening or welding. The series of partitions 206 is secured to the carrier partition top 204 and the carrier partition bottom 208 by various means such as fastening and welding, as will be detailed in relation to FIG. 7 below. In some implementations, there are twenty-five cages 104 in a server system 100. The fastening of the partitions 206 between the carrier partition top 204 and the bottom 208 may be performed by using rivets, screws, nails, pins, levers, welds, adhesives, or other fastening means.

Figure 2B:
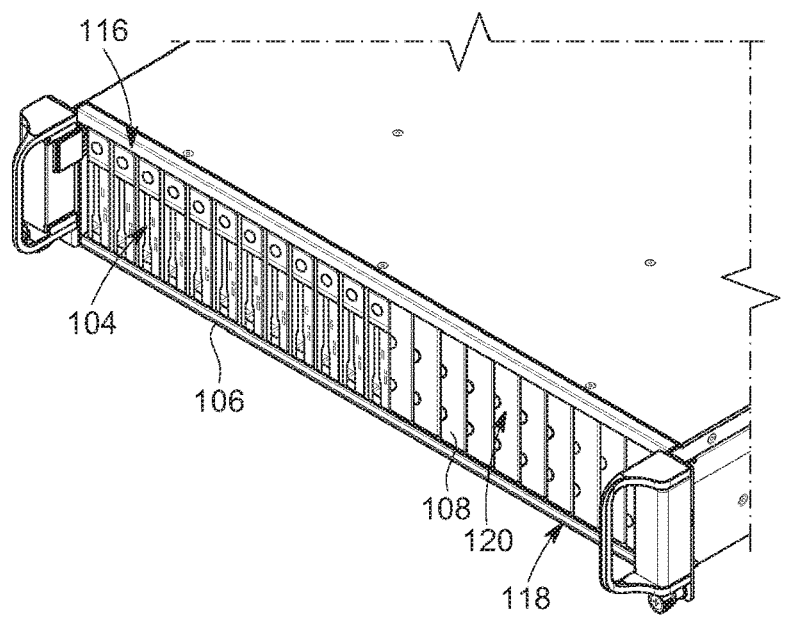
FIG. 2B is a close-up view of a server system with both carriers and example cover devices inserted in the cages.
Figure 2C:
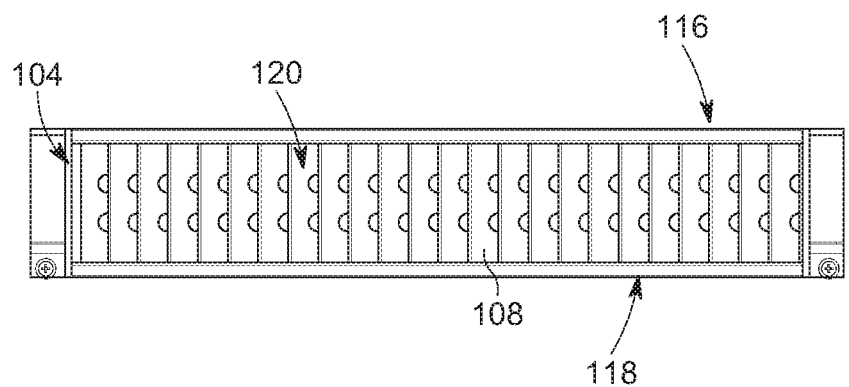
FIG. 2C is a front view of a server system with example cover devices inserted in the cages.

FIGS. 2B-2C illustrate further embodiments of the cover 120 in the server system 100 shown in FIG. 1. As illustrated in FIG. 2B, the cages 104 may contain cages with carriers 106 and cages with cover devices 108, which contain components such as covers 120 and partitions 206 in a first orientation. As illustrated by FIG. 2C, the cages 104 may contain only covers 120 in a rotated orientation. Thus, the covers 120 may be placed over all of the cages 104 in either vertical orientation. Alternatively, the covers 120 may be placed in only some of the cages 104 of the server system 100.

Figure 3:
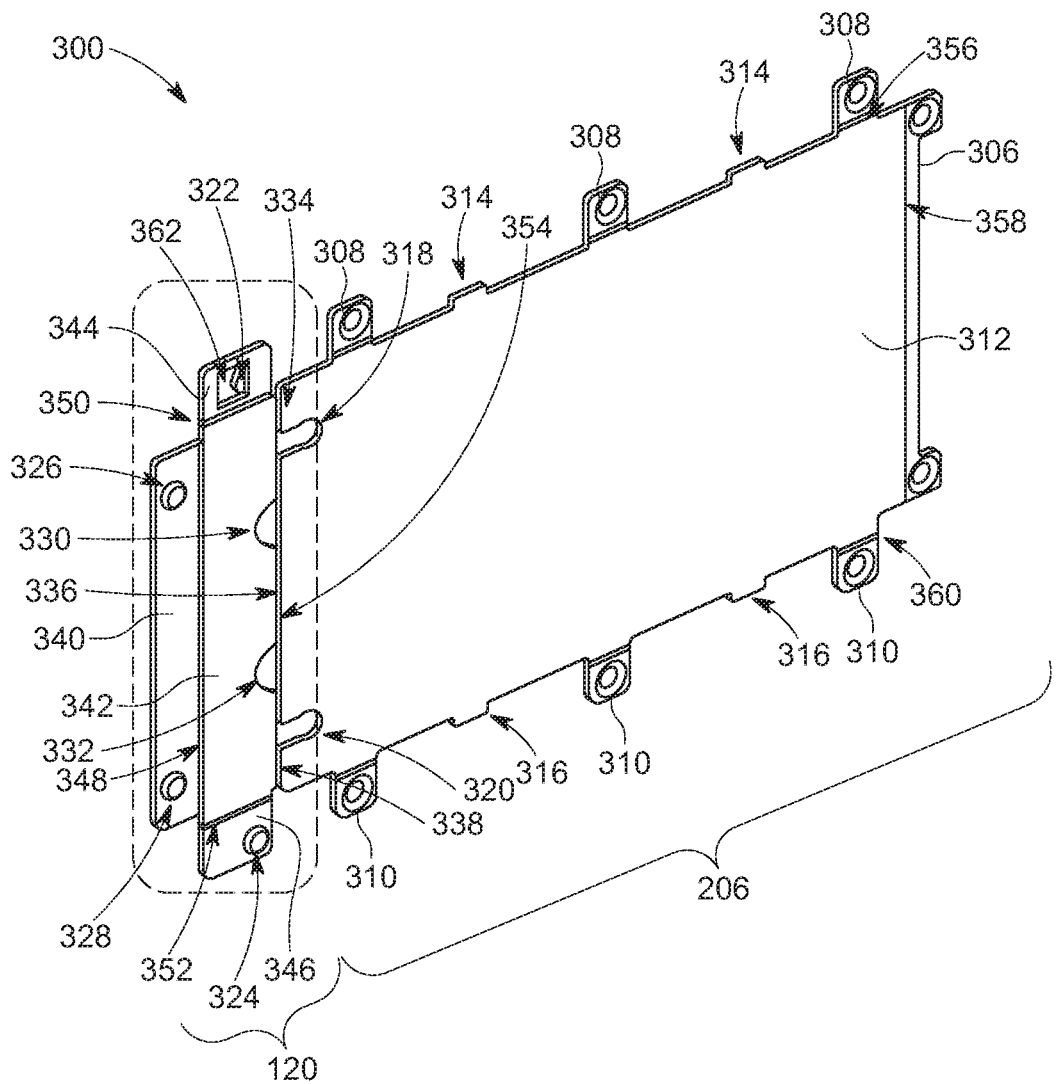
FIG. 3 is a perspective view of an example cover device for a carrier holder.

FIG. 3 illustrates an example cover device 300. The cover 120 and one of the partitions 206 may make up the cover device 300. Like elements in FIGS. 1-2 are labeled with the same reference numbers in FIG. 3. The cover device 300 may be made of a material such as metal or plastic. In this example, the cover device 300 is made of sheet metal such as steel, tin, aluminum, nickel, brass, copper, and titanium. In the illustrated embodiment, the cover device 300 is made of sheet metal, and the cover 120 and the partition 206 are fabricated from the same piece of sheet metal.

The cover 120 may include a main panel 342, a top panel 344, and a bottom panel 346. The main panel 342 may include a top cutout 330 having a half-ellipse shape, a bottom cutout 332 having a half-ellipse shape, and a side front edge 348, a top front edge 350, and a bottom front edge 352. The top panel 344 may include a top hook 322 and a top aperture 362. The top panel 344 may be connected to the main panel 342 via the top front edge 350. The bottom panel 346 may include a bottom emboss 324. The bottom panel 346 may be connected to the main panel 342 via the bottom front edge 352. The side panel 340 may include a first side emboss 326 and a second side emboss 328. The side panel 340 may be connected to the main panel 342 via the side front edge 348. The main panel 342 may also include a first joint 334, a second joint 336, and a third joint 338 located along a vertical edge 354. The vertical edge 354 may connect the cover 120 and the partition 206.

In some implementations, the top hook 322 is located on the top panel 344 and contains a wedge-shaped protrusion extending perpendicularly through the thickness of the material of the top panel 344 in an inward direction, where the components facing outward in FIG. 3 have an outward surface and an opposite inward surface, relative to the top panel 344, and perpendicularly angled toward the partition 206. In some implementations, the top hook 322 is fabricated by a stamp press such that the sheet metal material is removed from the top panel 344 to create the top hook 322, leaving the top aperture 362 in the top panel 344. In some implementations, the bottom emboss 324 is located on the bottom panel 346. The bottom emboss 324 in this example is circular-shaped depression extending perpendicularly in an outward direction from the bottom panel 346. In some implementations, the bottom emboss 324 is fabricated by a stamp press such that the material forms a circular shape on the bottom panel 346 that indents the material on an interior of the bottom panel 346 and protrudes the material on an exterior portion of the bottom panel 346. In some implementations, the first side emboss 326 and the second side emboss 328 are located on the side panel 340. Each of the side embosses 326 and 328 are a circular-shaped depression extending perpendicularly in an outward direction relative to the side panel 340. In some implementations, the first side emboss 326 and the second side emboss 328 are fabricated by a stamp press such that the material forms a circular shape on the side panel 340 that indents the material on an interior of the side panel 340 and protrudes the material on an exterior portion of the side panel 340.

In some implementations, the top cutout 330 has a half-ellipse shape, and the bottom cutout 332 has a half-ellipse shape. The cutouts 330 and 332 are both located on an edge of the main panel 342. In some implementations, the top cutout 330 and the bottom cutout 332 assist in detaching the cover 120 from the partition 206 by providing a stable mechanism where force can be applied, but the cover 120 maintains its structural integrity. In some implementations, the top cutout 330 and the bottom cutout 332 function to increase the flow of air throughout the cage 104 when the cover 120 is inserted. In some implementations, the first joint 334, a second joint 336, and a third joint 338 are located between the main panel 342 of the cover 120 and a primary panel 312 of the partition 206.

It should be understood that there may be greater or fewer than three embosses on the cover 120. It should also be understood that there may be greater or fewer than two cutouts on the cover 120 as illustrated. It should also be understood that there may be greater or fewer than three joints on the cover 120 as illustrated.

As illustrated, the partition 206 may include a primary panel 312, a back rivet panel 306, three top rivet panels 308, three bottom rivet panels 310, and a top partition edge 356, a back partition edge 358, and a bottom partition edge 360. The primary panel 312 may also include two top flaps 314 and two bottom flaps 316 extending from the primary panel 312. The flaps 314 and 316 may assist a user in installing the partition 206 to a cage 104 as a way to move the partition before installation and may align the partition within the cage 104 and secure its place within the cage 104 such that it is in a fixed position. The primary panel 312 may also include a top round slot 318 and a bottom round slot 320. The slots 318 and 320 may assist in securing the cover 120 in a fixed position, as described in FIGS. 11A-11C. The rivet panels 306, 308, and 310 may include holes where rivets can enter to secure the partition 206 to the cage 104. The back rivet panel 306 may be connected to the primary panel 312 via the back partition edge 358. The three top rivet panels 308 may be connected to the primary panel 312 via the top partition edge 356. The three bottom rivet panels 310 may be connected to the primary panel 312 via the bottom partition edge 360.

It should be understood that there may be different numbers of top rivet panels 308, bottom rivet panels 310, and back rivet panels 310 on the partition 206. It should also be understood that there may be greater or fewer than two top flaps 316 and two bottom flaps 318 on the partition 206. It should also be understood that there may be greater or fewer than two top round slots 318 and two bottom round slots 320 on the partition 206.

Figure 4A:
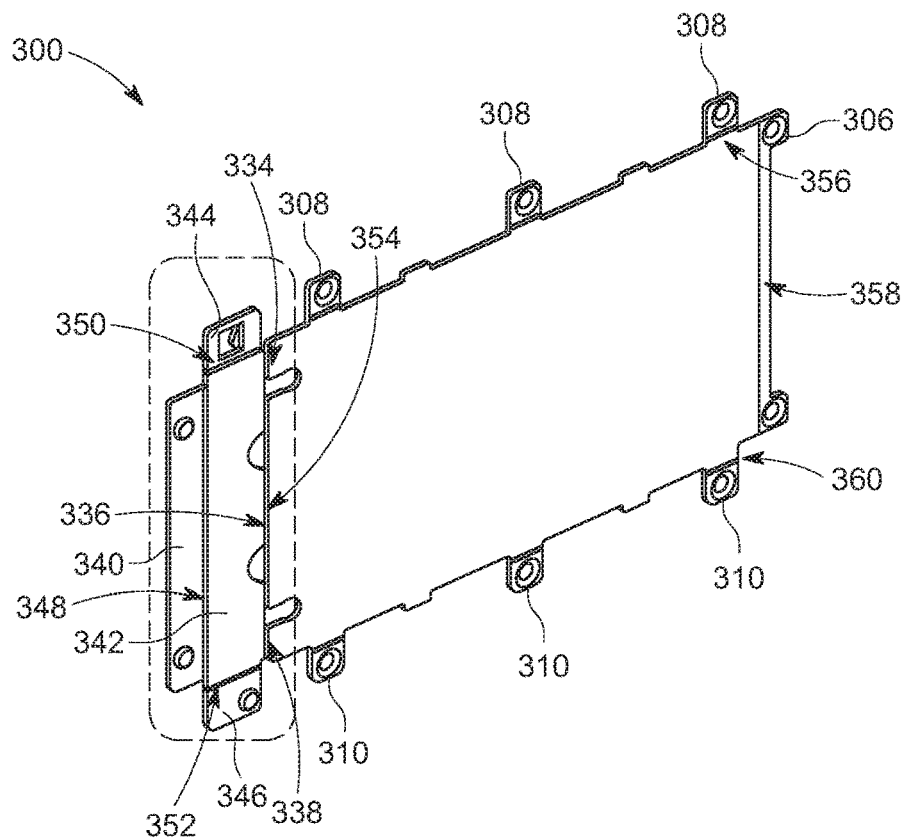
FIG. 4A is a perspective view of the example cover device of FIG. 3 in a flat position.
Figure 4B:
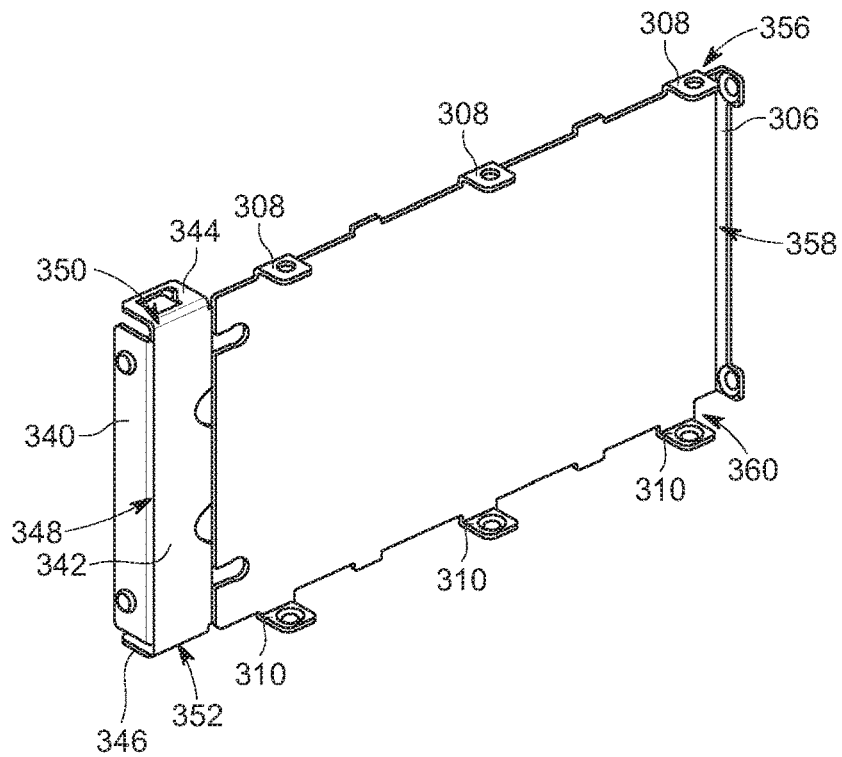
FIG. 4B is a perspective view of the example cover device of FIG. 4A in a first folded position.
Figure 4C:
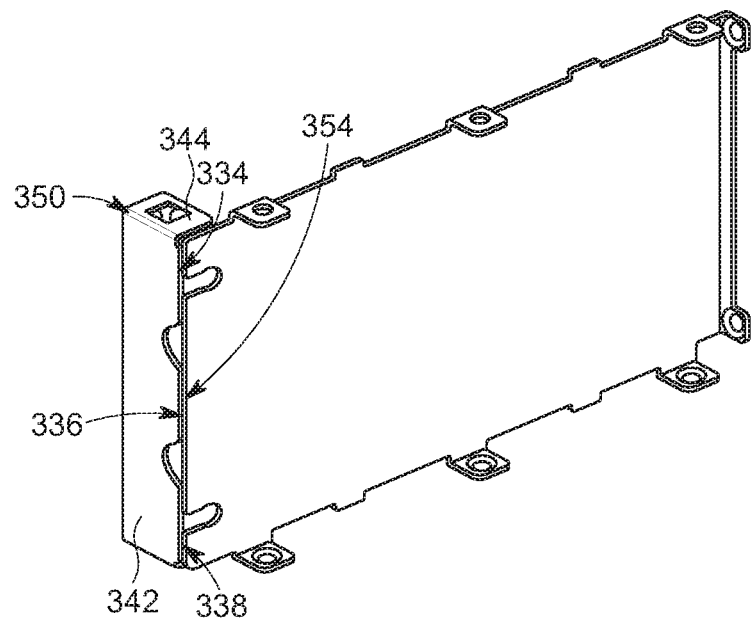
FIG. 4C is a perspective view of the example cover device of FIG. 4B in a second folded position.

As illustrated in FIGS. 4A-4C, the cover device 300 may be folded to form the cover 120 and partition 206 in FIG. 2A. FIG. 4A illustrates the cover device 300 when initially produced from a sheet of metal. As illustrated in FIG. 4A, the cover device 300 includes the side panel 340, the main panel 342, the top panel 344, the bottom panel 346, the side front edge 348, the top front edge 350, the bottom front edge 352, the top partition edge 356, the back partition edge 358, a bottom partition edge 360, the top rivet panel 308, the bottom rivet panel 310, and the vertical edge 354 (in FIG. 4C).

FIG. 4B illustrates the flat cover device 300 in a first folded position. The first folded position includes bending the side panel 340 along the side front edge 348 in an interior direction to a perpendicular position relative to the main panel 342. The first folded position also includes bending the top panel 344 along the top front edge 350 in an interior direction to a perpendicular position relative to the main panel 342. The first folded position also includes bending the bottom panel 346 along the bottom front edge 352 in an interior direction to a perpendicular position relative to the main panel 342. Thus, the three previously described panels 340, 344, and 346 folded inward are adjacent to one another. The first folded position also includes bending the top rivet panel 308 along the top partition edge 356 in an outward direction. The first folded position also includes bending the bottom rivet panel 310 along the bottom partition edge 360 in an outward direction. The first folded position also includes bending the back rivet panel 306 along the back partition edge 358 in an outward direction. Thus, the three previously described rivet panels 306, 308, and 310 folded outward are adjacent to one another.

FIG. 4C illustrates the flat cover device 300 in a second folded position. The second folded position includes all the folds of the first folded position as illustrated in FIG. 4B. The second folded position also includes bending the joints 334, 336, 338 along the vertical edge 354 in an interior direction. The completed second folded position illustrates the embodiment of cover device 300 that covers the cage 104 (shown in FIG. 1A)

Figure 5A:
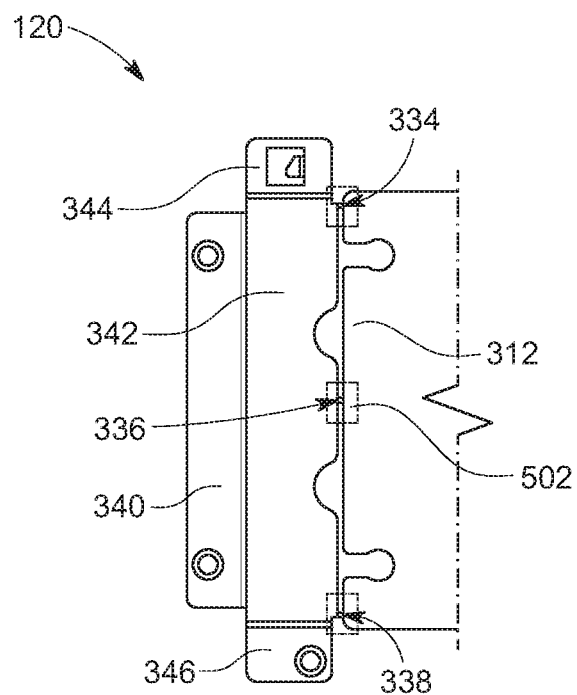
FIG. 5A is an exploded view of an example cover of the cover device of FIG. 3.
Figure 5B:
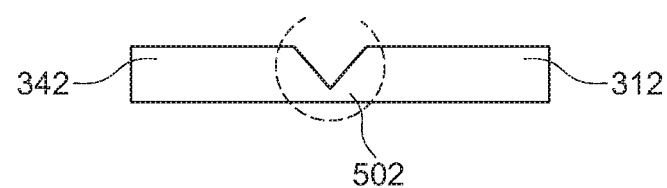
FIG. 5B is an exploded view of a joint between the cover and the partition of the example cover of FIG. 5A.

A top view of the first joint 334, the second joint 336, and the third joint 338 of the cover device 300 is shown in FIG. 5A. Each joint 334, 336, 338 may be bent along a scoring indentation 502, as shown in a close-up side view of the cover 120 in FIG. 5B. FIG. 5B shows a joint in relation to the main panel 342 of the cover 120 and the primary panel 312 of the partition 206. A scored indentation 502 is created to facilitate the folding of one of the joints 334, 336, or 338. As illustrated in FIG. 5B, the scored indentation 502 has a general shape of the letter "V," although it is understood other shapes may be implemented. It is understood that while there are three joints 334, 336, and 338 illustrated in this example, more or less joints may be used. The joints 334, 336, and 338 are relatively thin, and may be made of ductile material such that bending them to form approximately right angle would not, alone, tear, rip, score, cut, or otherwise break the joint upon one bend.

Figure 5C:
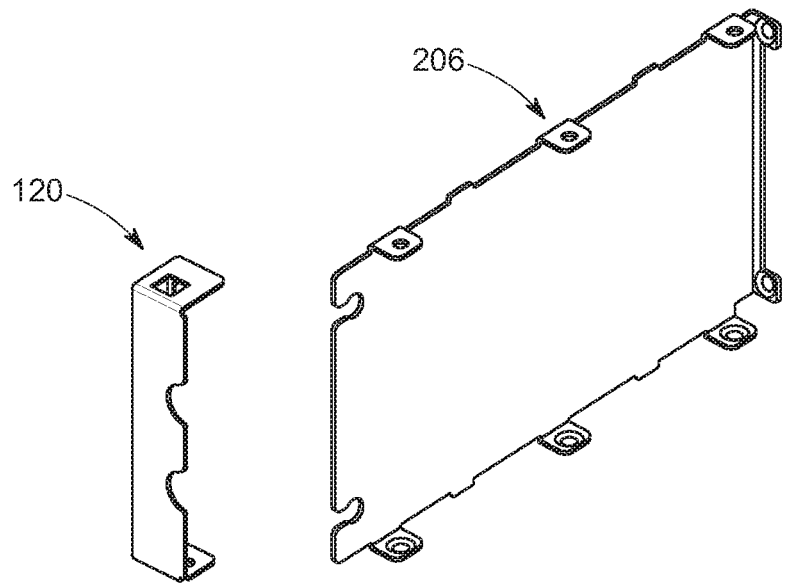
FIG. 5C is a perspective view of another implementation of another example cover device separated into a cover portion and a partition portion.

As illustrated in FIG. 5C, the cover 120 and the partition 206 may be separated. The joints 334, 336, 338 are scored such that they may be bent at least once and still maintain the attachment of the main panel 342 of the cover 120 and the primary panel 312 of the partition 206. However, upon sufficient force used to harden the ductile material in the scored joints 334, 336,338, the material will break along the joint, thus separating the cover 120 and the partition 206.

Figure 6:
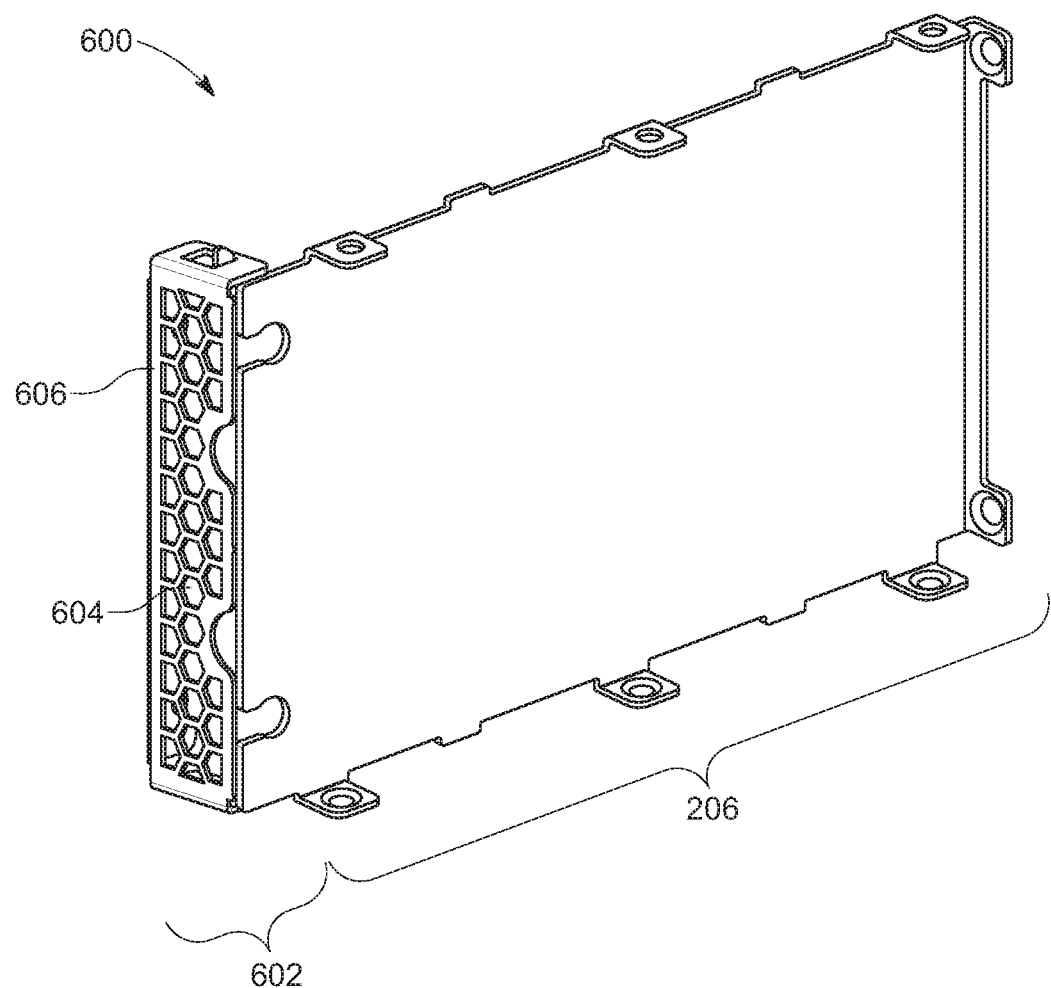
FIG. 6 is a perspective view of another implementation of an example cover device with another implementation of a cover portion.

In another embodiment of an example cover device 600, as illustrated in FIG. 6, the cover device 600 may include the partition 206 and another implementation type of cover 602. The cover 602 includes a main panel 606 and cutout holes 604. The cutout holes 604 may have a round shape. There may be multiple cutout holes 604 on the main panel 606 of the cover 602. The cutout holes 604 may be arranged in a pattern such as the three interposed rows shown in FIG. 6. The cutout holes 604 allow additional airflow through the cover 602 to the server system 100. Thus, the cutout holes 604 may be circular, square, oval, or rectangular shapes. The holes 604 may vary in size, location, and amount to optimize airflow.

Figure 7A:
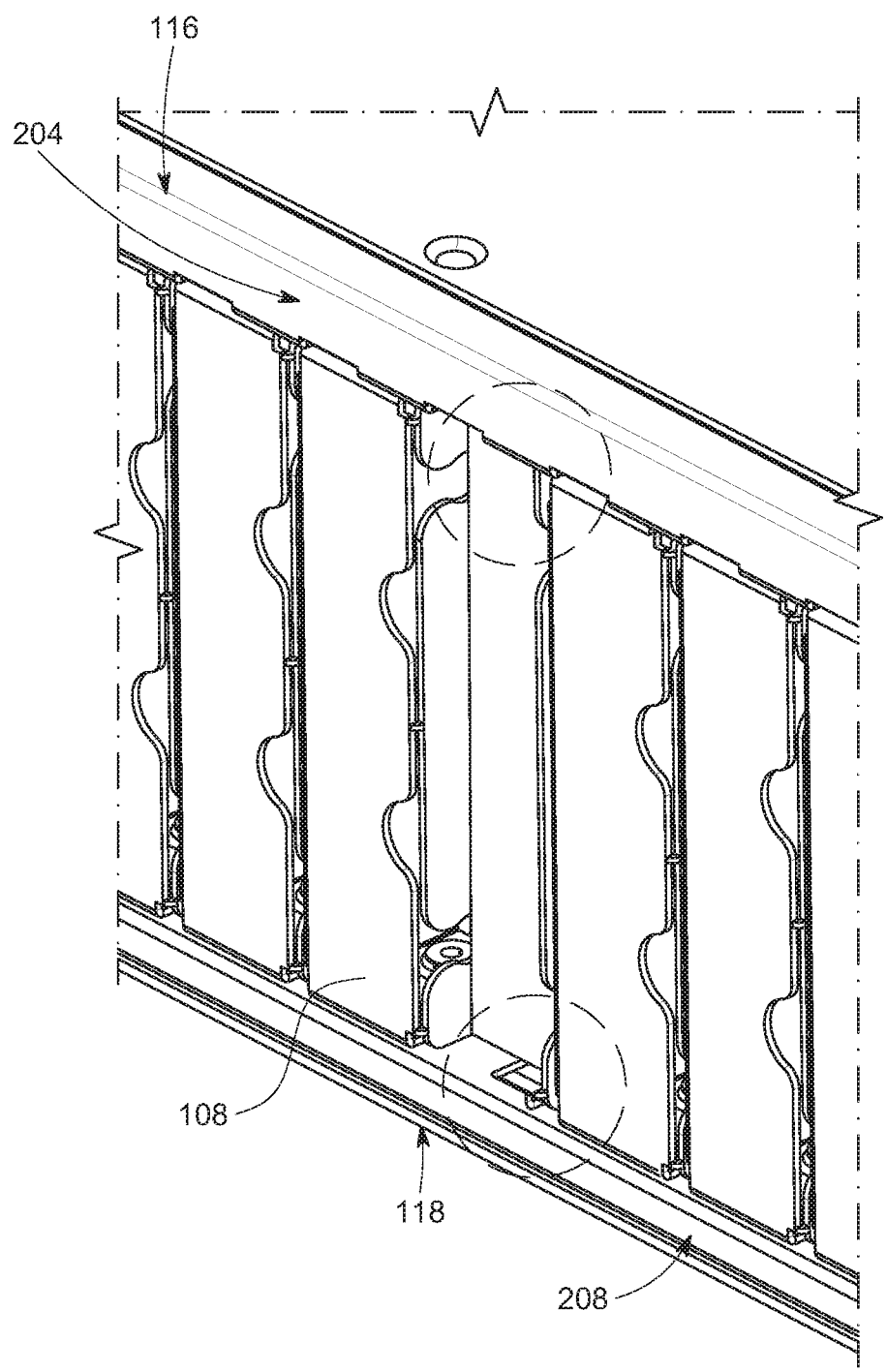
FIG. 7A is a close-up view of an example cover device in a server system.
Figure 7B:
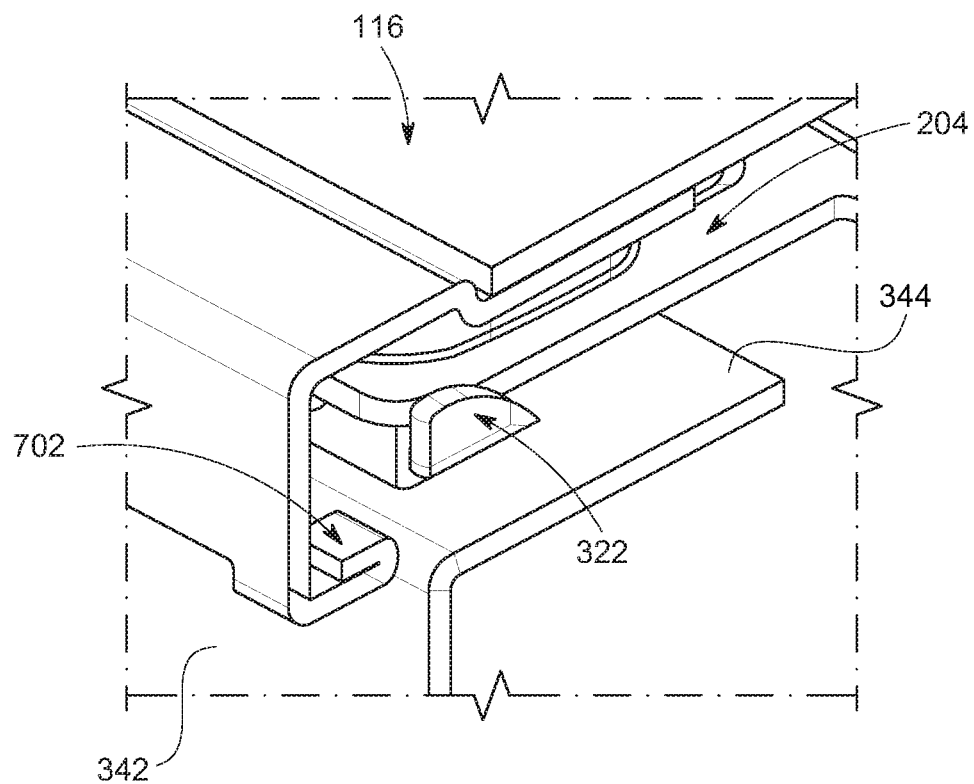
FIG. 7B is a cross-sectional view of a top portion of the example cover device of FIG. 7A.

FIG. 7A illustrates the cover 120 (shown in FIG. 1B) in the server system 100 (shown in FIG. 1A). The partition 206 of the cover device 300 is secured to the server system 100 by a fastening method, as described in FIG. 2. FIG. 7B illustrates a cross-sectional view of a top portion of the cover 120 of FIG. 7A. The cover 120 is secured in place by the joints 334, 336 and 338 (shown in FIG. 4C and FIGS. 5A-B), while maintaining contact with the partition 206. In this placement, the top hook 322 keeps the cover 120 from moving in other directions except in a downward direction. In some implementations, an outer top portion 702 of the carrier partition top 204 secures the top hook 322 in a fixed position.

Figure 7C:
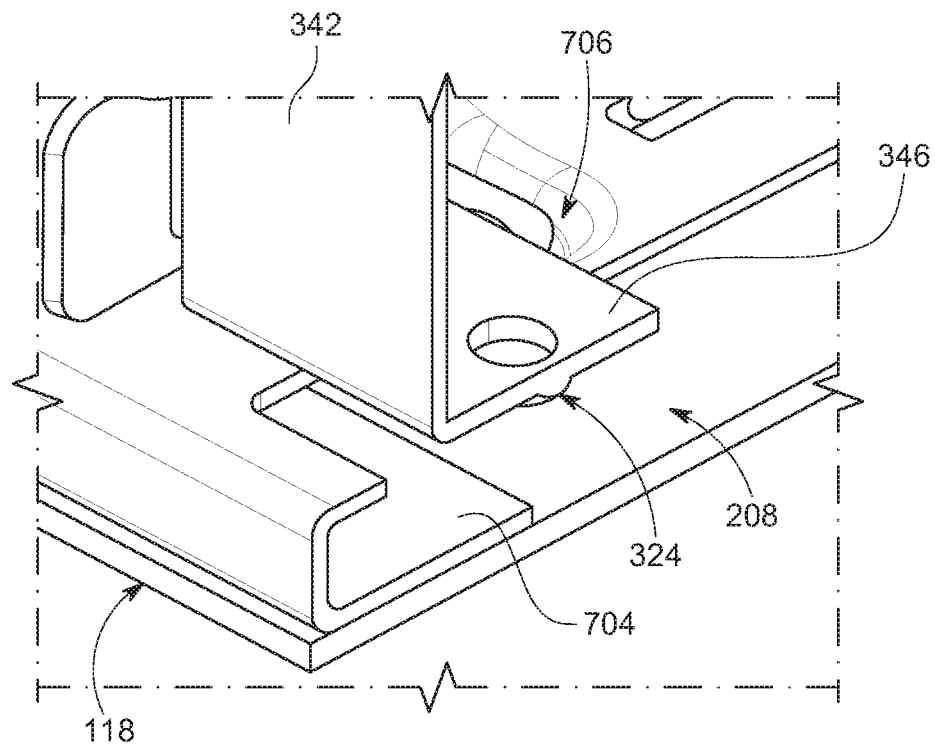
FIG. 7C is a cross-sectional view of a bottom portion of the example cover device of FIG. 7A.

FIG. 7C is a cross-sectional view of a bottom portion of the cover 120 of FIG. 7A. In this placement, the cover 120 maintains contact in the carrier partition bottom 208 by the bottom emboss 324 as illustrated in FIG. 7C. The bottom emboss 324 may keep the cover 120 from moving in a forward direction relative to the server system 100. In some implementations, as will be described in FIG. 8A, the bottom emboss 324 may not restrict movement in a backward direction by a groove 706 of the carrier partition bottom 208. All of the covers 120 in FIGS. 1A-B are fixed by the process described in FIGS. 7A-7C.

Figure 8A:
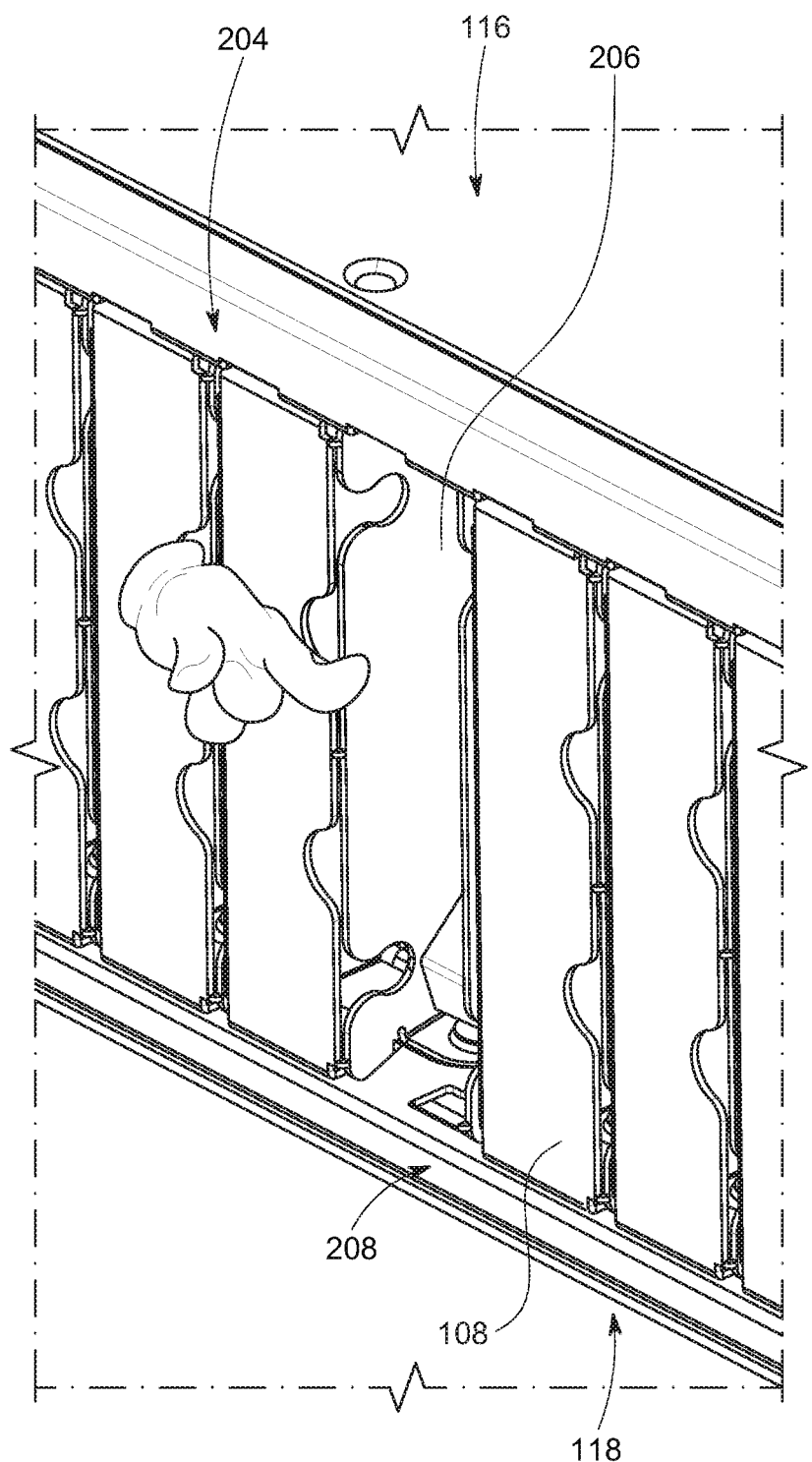
FIG. 8A is a close-up view of the removal of the cover device in a server system.
Figure 8B:
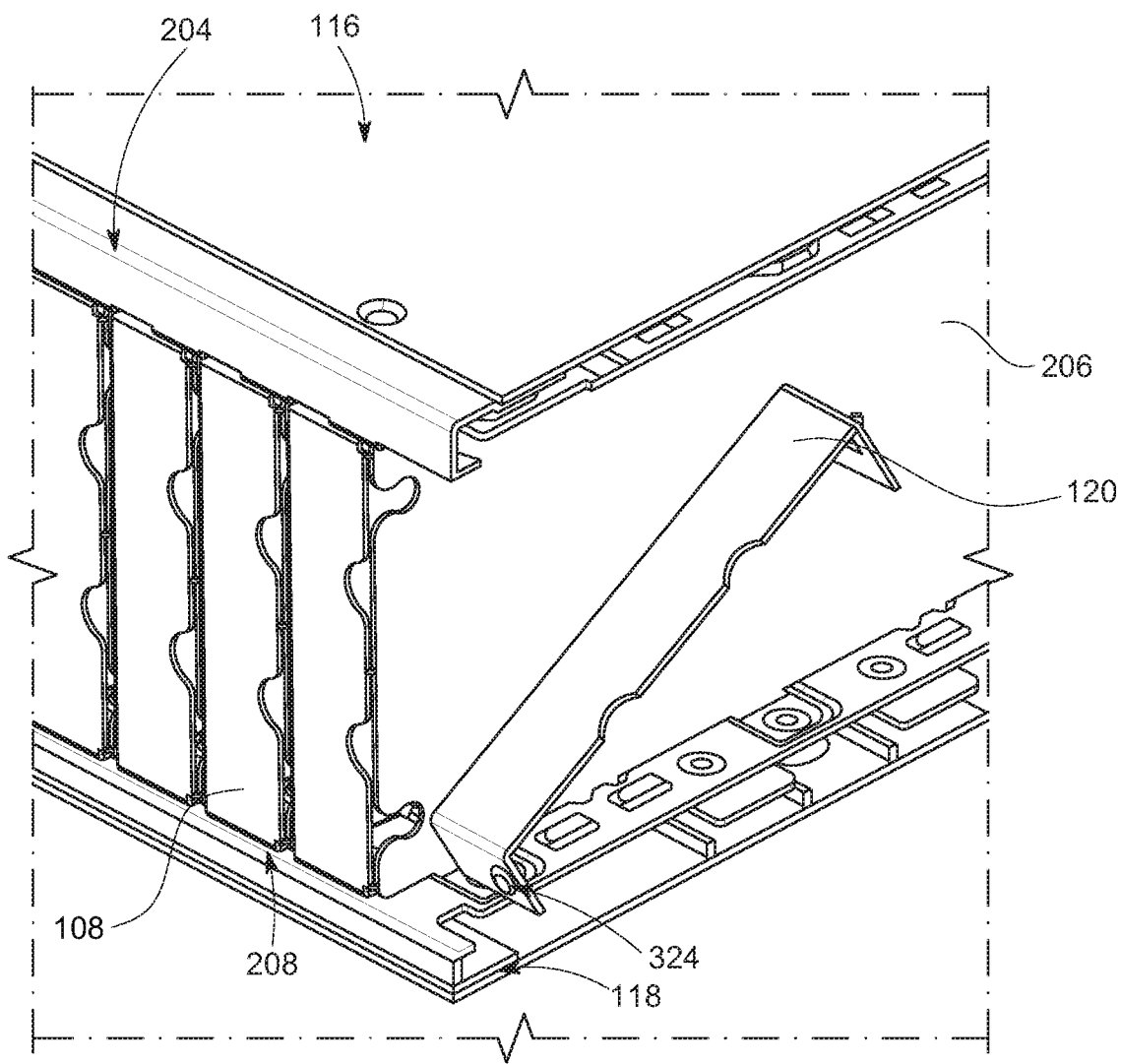
FIG. 8B is a cross-sectional view of the removal of the cover device of FIG. 8A.
Figure 8C:
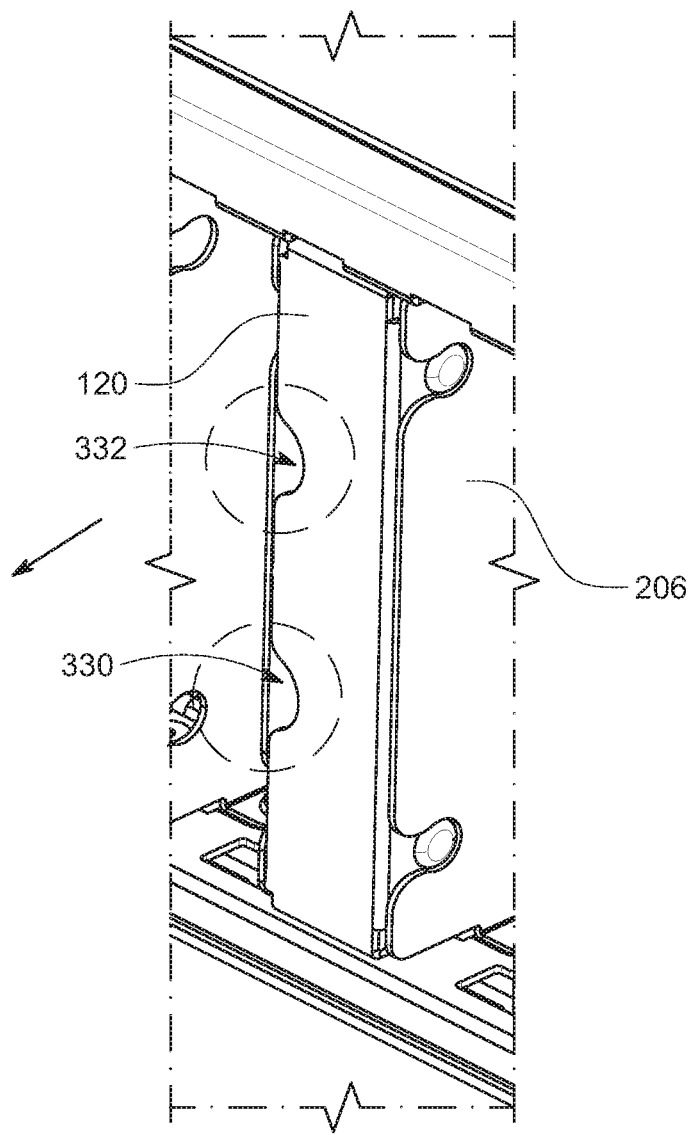
FIG. 8C is a close-up view of another implementation of the removal of a cover device in a server system.

FIGS. 8A-C illustrate removal of the cover 120 from the server system 100. Like elements in FIGS. 3-5 are labeled with the same reference numbers in FIGS. 8A-8C. The cover 120 has been installed with the process described by FIGS. 7A-7C, and thus covers one of the cages 104 shown in FIG. 2. Applying force on the cover 120 in the backward direction, where the backward direction is toward the server system 100, allows for its removal by overpowering the force applied by the top hook 322 against the carrier partition top 204, and the bottom emboss 324 (in FIG. 8B) against the carrier partition bottom 208 to maintain the cover 120 in the server system 100. When such force is applied, the cover 120 may be separated from the partition 206. FIG. 8B is a perspective view of the server system 100 that illustrates that the cover 120 may be separated from the partition 206. FIG. 8C is a close-up perspective view of the cage 104 that illustrates applying a force on the cover 120 in a direction away from the server system 100 using the top cutout 330 and the bottom cutout 332 as force application points by a tool or a user's fingers. When such force is applied, FIG. 8C illustrates that the cover 120 may be separated from the partition 206.

Figure 9A:
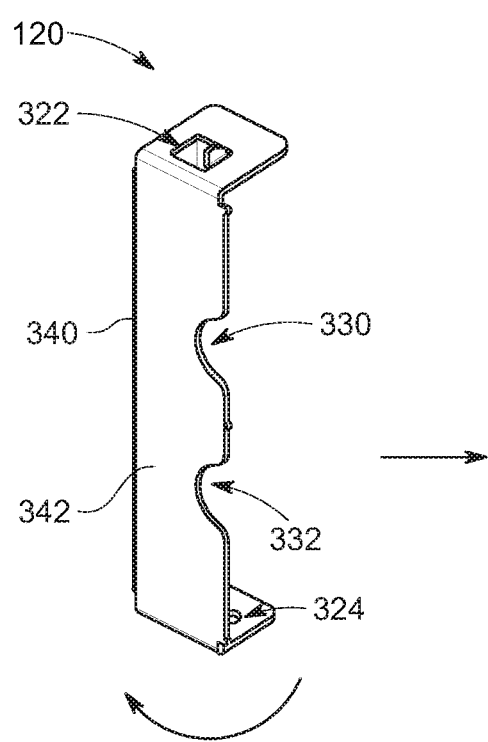
FIG. 9A is a perspective view of an example cover removed from the cover device.
Figure 9B:
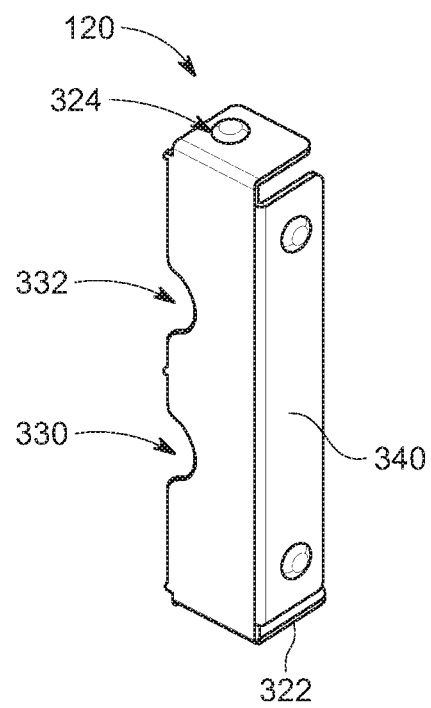
FIG. 9B is a perspective view of the example cover of FIG. 9A rotated 180 degrees.

FIG. 9A is a perspective view of the cover 120 removed from a cover device 300. As illustrated in FIG. 9A, the cover 120 has the top hook 322 located on a top portion of the cover 120, the side panel 340 on a left side of the font panel 342, and the bottom emboss 324 on a bottom portion of the cover 120. When the cover 120 is removed, it may be rotated approximately 180 degrees to a rotated orientation such that the bottom emboss 324 is on the top portion, and the top hook 322 is on the bottom portion, as illustrated in FIG. 9B. In FIG. 9B, the cover 120 has the bottom emboss 324 located on the top portion of the cover 120; the side panel 340 on a right side of the font panel 342; and the top hook 322 on the bottom portion of the cover 120. The cover 120 may thus be inserted to cover one of the cages 104 in the rotated orientation. It should be understood that the cover 120 may be used multiple times in its original orientation. Furthermore, it should be understood that the cover 120 may be used multiple times in its rotated orientation.

Figure 10A:
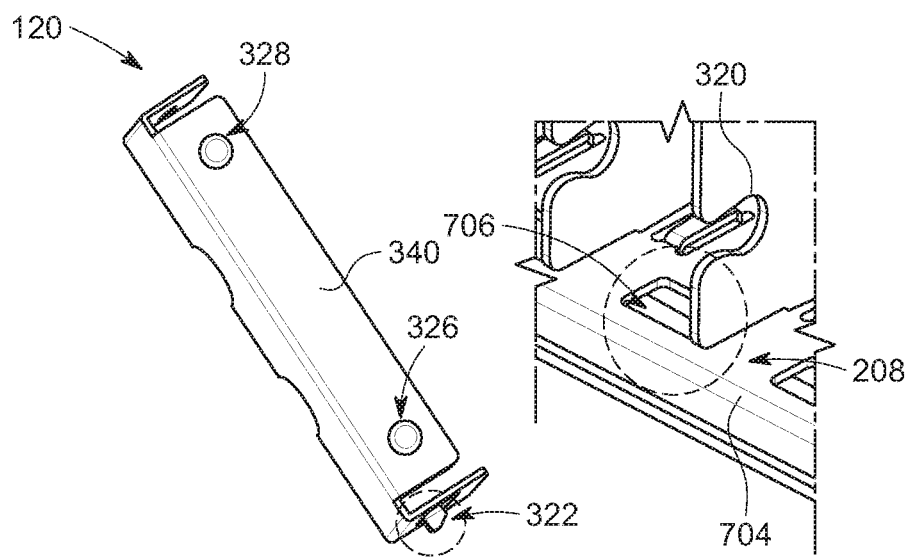
FIG. 10A is a perspective view of a rotated example cover of a server system.

FIG. 10A is a perspective view of a rotated cover 120 that illustrates the placement of the cover 120 in its rotated orientation. Like elements in FIGS. 3-5 are labeled with the same reference numbers in FIGS. 8A-8C. In this example, the cover 120 is inverted from the position shown in FIG. 9A by engaging a bottom portion of the cover 120, where the top hook 322 is located with the carrier partition bottom 208. When the rotated cover 120 is inserted in the server system 100, the top hook 322 reverses places with the bottom emboss 324, such that the two are 180 degrees from the placement shown in FIG. 9A.

Figure 10B:
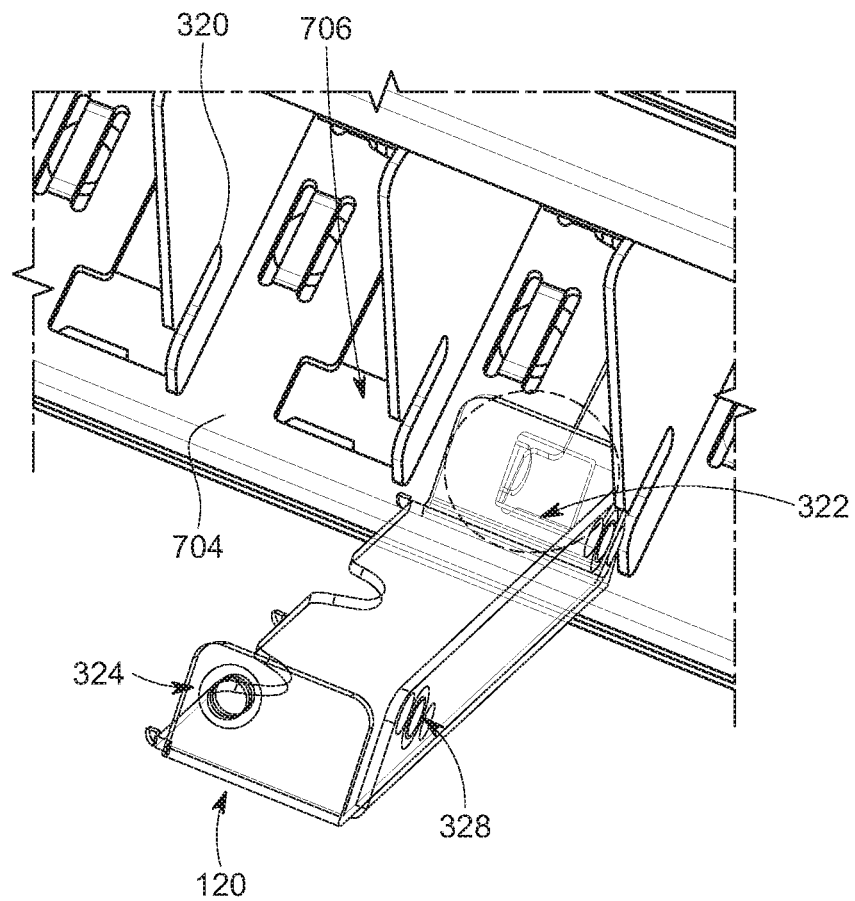
FIG. 10B is a top-perspective view of a bottom portion of the rotated cover of FIG. 10A placed in the server system.
Figure 10C:
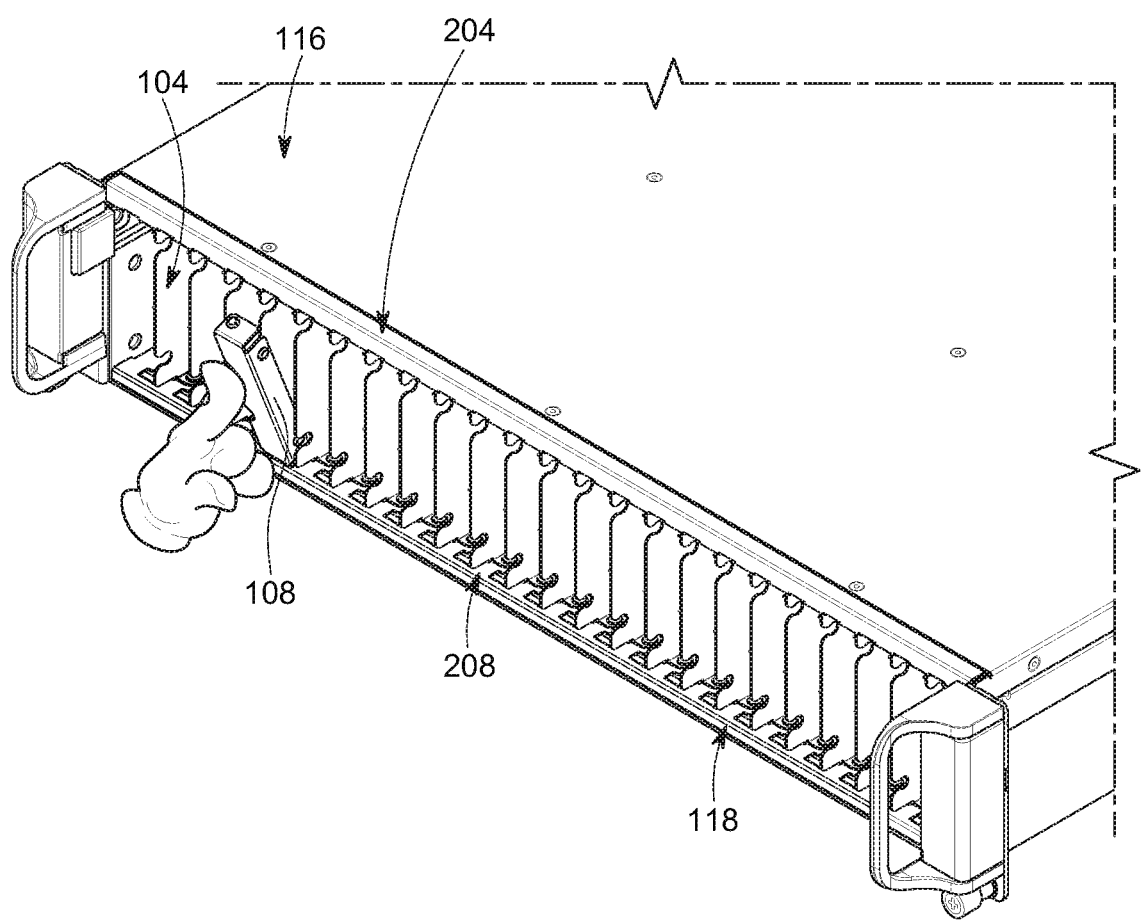
FIG. 10C is a perspective view of the rotated cover of FIG. 10A placed in the server system.

FIG. 10B is a top-perspective view of a bottom portion of the rotated cover of FIG. 10A placed in the server system 100. As shown in FIG. 10B, the top hook 322 is first secured on the carrier partition bottom 208 by fitting the protruding hook of the top hook 322 into the groove 706 of the carrier partition bottom 208 outlined the outer bottom portion 704; thus fixing it in place. FIG. 10C is a perspective view of the system 1000 that illustrates the placement method. As show in FIG. 10C, the bottom emboss 324 is secured on the carrier partition top 204 by the protruding emboss of the bottom emboss 324 going under and past the outer bottom portion 704 and into the groove 706; thus fixing it in place, as shown in FIG. 11B.

Figure 11A:
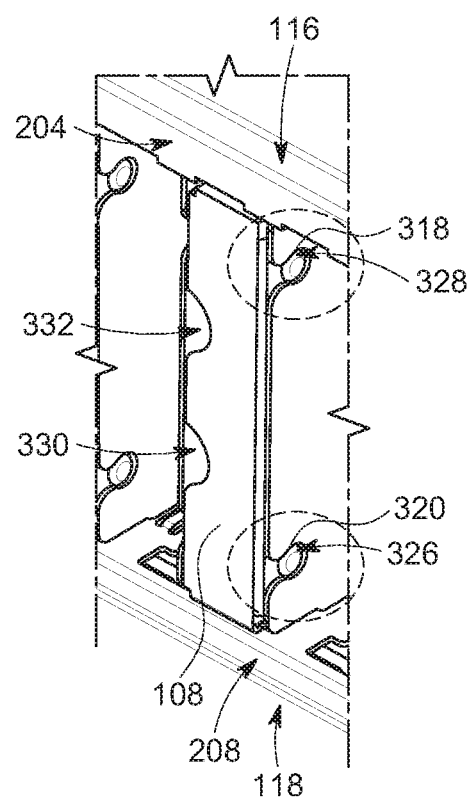
FIG. 11A is a close-up view of another rotated example cover device in a server system.
Figure 11B:
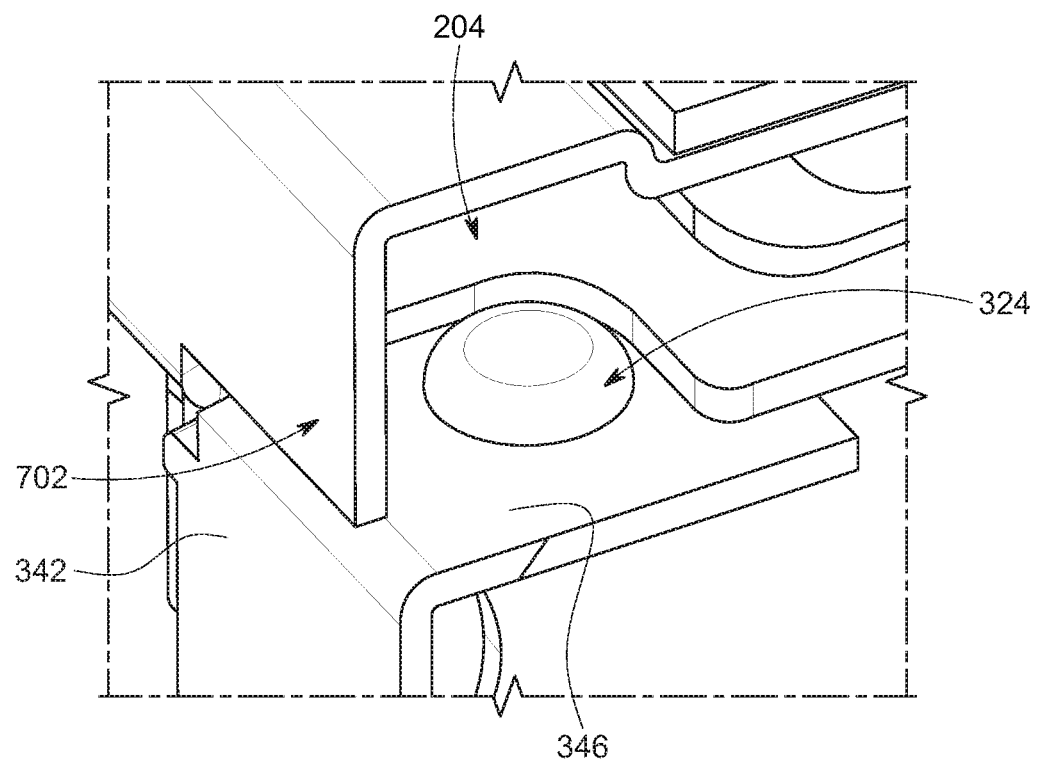
FIG. 11B is a close-up view of a top portion of the cover device of FIG. 11A inserted in a cage.
Figure 11C:
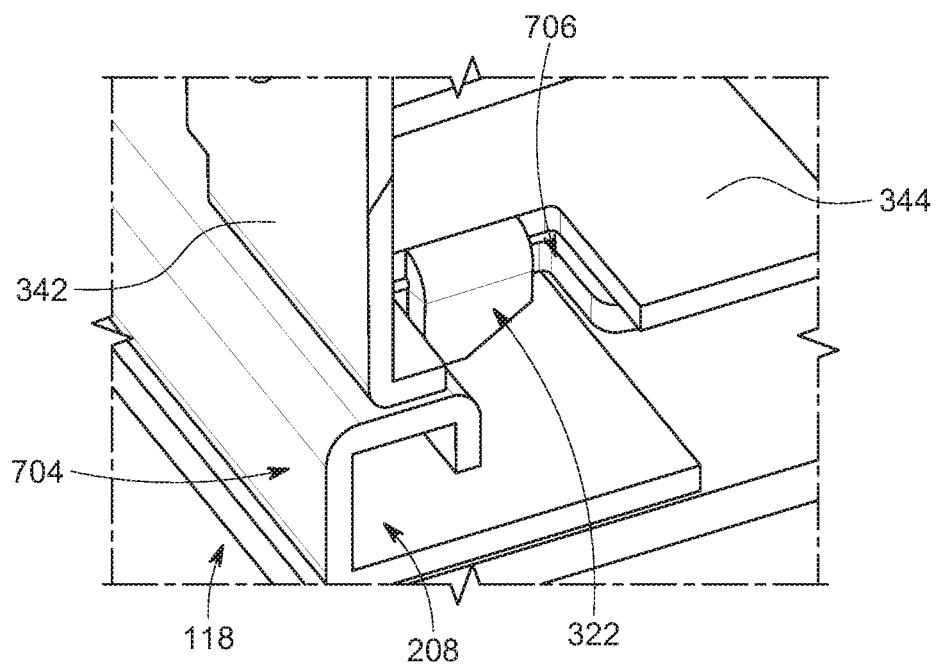
FIG. 11C is a close-up view of a bottom portion of the cover device of FIG. 11A inserted in a cage.

FIG. 11A is a close-up view of a rotated cover 120 in a server system 100. In the rotated orientation, the top cutout 330 and the bottom cutout 332 are placed on the left side of the server system 100. In the rotated orientation, the second side emboss 328 is secured by the top round slot 318 near carrier partition top 204. In a similar manner, the first side emboss 326 is secured by the bottom round slot 320 near the carrier partition bottom 208. FIG. 11B is a close-up view of the carrier partition top 204 when the cover 120 has been rotated. Additionally, the top hook 322 and top panel 344 are secured by the carrier partition bottom 208 in the rotated orientation, as illustrated in FIG. 11B. The outer top portion 702 fixes the bottom emboss 324 in place. FIG. 11C is a close-up view of the carrier partition bottom 208 when the cover 120 has been rotated. The bottom emboss 324 and the bottom panel 346 are secured by the carrier partition top 206 in the rotated orientation, as illustrated in FIG. 11C. The outer bottom portion 704 fixes the top hook 322 in place. Thus, FIGS. 11A-C illustrate the final placement of the rotated cover 120 shown in FIGS. 8A-8C in the server system 100.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A component for a cage having a front opening, and parallel top and bottom structures for holding electronic devices in a computing system, the component comprising:
 a cover having a hook, an emboss, and a main panel, wherein the cover is couplable to the cage by the hook and emboss; and
 a partition having a primary panel joined to the main panel of the cover via a joint, the primary panel including a top edge with a fastener panel and an opposite bottom edge with a fastener panel, wherein the partition is perpendicularly insertable into the cage through the front opening, wherein the fastener panel of the top edge is attachable to the top structure of the cage and the fastener panel of the bottom edge is attachable to the bottom structure of the cage when the partition is inserted into the cage, and wherein the cover and the partition are fabricated as a single piece and wherein the cover is detachable from the partition by breaking off the main panel of the cover from the primary panel at the joint.

2. The component of claim 1, wherein the main panel of the cover and the primary panel of the partition are joined at a common edge, wherein a scored line defines the common edge.

3. The component of claim 1, wherein the hook of the cover engages with a matching feature of a top portion of the cage, and the emboss of the cover engages with a matching feature of a bottom portion of the cage.

4. The component of claim 3, wherein cage includes walls that are defined by the partition, a section of the top portion, and a section of the bottom portion.

5. The component of claim 1, wherein the cover further comprises a cutout positioned perpendicular to a fan in the computing system to increase airflow.

6. The component of claim 1, wherein the cover and the partition are sheet metal, wherein the sheet metal maintains structural integrity after the cover is removed from the partition and the cage.

7. The component of claim 1, wherein the cover further comprises a cutout positioned on the main panel of the cover to assist with removal of the cover from the cage and the partition.

8. The component of claim 1, wherein the fastener panels of the top and bottom edges of the partition are fastened to the cage via a fastener, and wherein the fastener is one of a rivet, a pin, a screw, a nail, a pin, a lever, a weld, or an adhesive.

9. A component for a cage for holding electronic devices in a computing system, the component comprising:
 a cover having a hook, an emboss, and a main panel, wherein the cover is couplable to the cage by the hook and emboss; and
 a partition having a primary panel, wherein the partition is couplable to the cage by the primary panel, and wherein the cover is detachable from the partition, wherein
 (i) the cover is fixed to the cage in a first position; and
 (ii) the cover is removed from the cage and rotated approximately 180 degrees, and the rotated cover is fixed to the cage in a second position, wherein the emboss of the cover engages with a matching feature of a top portion of the cage and the hook of the cover engages with a matching feature of a bottom portion of the cage in the second position.

10. The component of claim 9, wherein the cover further comprises a second emboss, and wherein the second emboss engages with a slot of the partition in the second position.

11. A system having multiple cages, each cage for holding an electronic component, the system comprising:
 a chassis having a front opening, a top structure, and a bottom structure parallel to the top structure, wherein the top structure and the bottom structure define the multiple cages, and wherein each cage comprises:
 a cover having a hook, an emboss, and a main panel, wherein the hook of the cover is couplable to the top structure and emboss of the cover is couplable to the bottom structure of the chassis; and
 a partition having a primary panel initially joined to the main panel of the cover via a joint, the primary panel including a top edge with a fastener panel and an opposite bottom edge with a fastener panel, wherein the partition is perpendicularly insertable into the cage through the front opening, wherein the fastener panel of the top edge is attachable to the top structure of the cage and the fastener panel of the bottom edge is attachable to the bottom structure of the cage when the partition is inserted into the cage, wherein the cover and the partition are fabricated as a single piece, and wherein the partition is coupled to the top structure and the bottom structure of the chassis, wherein the cover is detachable from the partition by breaking off the main panel of the cover from the primary panel at the joint.

12. The system of claim 11, wherein the main panel of the cover and the primary panel of the partition are joined at a common edge, wherein a scored line defines the common edge.

13. The system of claim 11, wherein one of the multiple cages contains the cover and one of the multiple cages contains a memory storage device.

14. The system of claim 11, wherein one of the multiple cages contains the cover and one of the multiple cages contains a cover in a rotated position.

15. The system of claim 11, wherein the cover further comprises a cutout positioned perpendicularly to a fan in the system to increase airflow.

16. The system of claim 11, wherein the cover and the partition are sheet metal, wherein the sheet metal maintains structural integrity after the cover is removed from the partition and the cage.

17. The system of claim 11, wherein
 (i) the cover is fixed to the cage in a first position; and
 (ii) the cover is removed from the cage and rotated approximately 180 degrees, and the rotated cover is fixed to the cage a second position, wherein the emboss of the cover engages with a matching feature of a top portion of the cage and the hook of the cover engages with a matching feature of a bottom portion of the cage in the second position.

18. The system of claim 17, wherein the cover further comprises a second emboss, and wherein the second emboss engages with a slot of the partition in the second position.

19. The system of claim 11, wherein the cover further comprises a cutout positioned on the main panel of the cover to assist with removal of the cover from the cage and the partition.

20. The system of claim 11, wherein the fastener panels of the top and bottom edges of the partition are fastened to the cage via a fastener, and wherein the fastener is one of a rivet, a pin, a screw, a nail, a pin, a lever, a weld, or an adhesive.

* * * * *